(12) United States Patent
Boyd, IV et al.

(10) Patent No.: US 6,248,201 B1
(45) Date of Patent: Jun. 19, 2001

(54) APPARATUS AND METHOD FOR CHIP PROCESSING

(75) Inventors: John E. Boyd, IV, Blandon; Patrick J. Drummond, Hamburg; Jonathan V. Haggar, Fleetwood; John S. Rizzo, Oley, all of PA (US)

(73) Assignee: Lucent Technologies, Inc., Murray Hill, NJ (US)

( * ) Notice: Subject to any disclaimer, the term of this patent is extended or adjusted under 35 U.S.C. 154(b) by 0 days.

(21) Appl. No.: 09/311,629

(22) Filed: May 14, 1999

(51) Int. Cl.[7] .............................. B32B 35/00; B23P 19/00
(52) U.S. Cl. ...................... 156/247; 156/230; 156/235; 156/344; 156/541; 156/584; 29/426.3; 29/426.5; 29/426.6; 29/742; 29/743
(58) Field of Search ..................... 156/230, 235, 156/247, 249, 344, 542, 584, 541; 29/426.3, 426.5, 426.6, 740, 743, 742

(56) References Cited

U.S. PATENT DOCUMENTS

| | | | |
|---|---|---|---|
| 3,785,507 | * | 1/1974 | Wiesler et al. . |
| 4,472,218 | * | 9/1984 | Avedissian et al. ............ 29/426.3 X |
| 4,526,646 | * | 7/1985 | Suzuki et al. ..................... 156/542 X |
| 4,724,030 | * | 2/1988 | Kurtz . |
| 4,797,994 | * | 1/1989 | Michaud et al. ................... 29/743 X |
| 4,915,565 | * | 4/1990 | Bond et al. ........................ 29/740 X |
| 4,990,051 | * | 2/1991 | Safabakhsh et al. . |
| 5,098,501 | * | 3/1992 | Nishiguchi ....................... 156/344 X |
| 5,270,260 | * | 12/1993 | Scheuenpflug . |
| 5,589,029 | * | 12/1996 | Matsui et al. ......................... 156/344 |
| 5,725,728 | * | 3/1998 | Fuke et al. ............................ 156/584 |
| 5,827,394 | * | 10/1998 | Lu ........................................ 156/344 |
| 5,871,610 | * | 2/1999 | Minohoshi et al. ............. 156/542 X |
| 6,039,833 | * | 3/2000 | Freund et al. ....................... 156/344 |

* cited by examiner

*Primary Examiner*—Curtis Mayes
(74) *Attorney, Agent, or Firm*—Dickstein Shapiro Morin & Oshinsky LLP

(57) ABSTRACT

A semiconductor chip transferring method and apparatus is described having a movable member, a flexible structure having adhesive on a lower surface thereof, a first transport assembly, and a second transport assembly. The first transport assembly is positioned beneath the support structure and includes a rotatable base upon which is mounted at least one arm. The movable member is extended into and flexes the support structure to transfer a semiconductor chip supported on a first side by the support structure to the arm which supports it on a second side. The first transport assembly moves the chip to the second transport assembly which may, in turn, move it to an output container which supports the second side. The chip has now been inverted from its initial orientation.

67 Claims, 6 Drawing Sheets

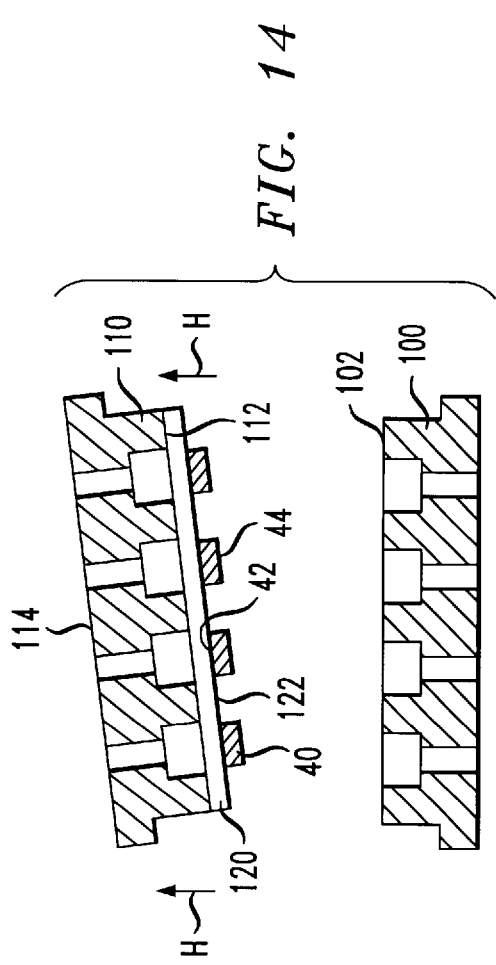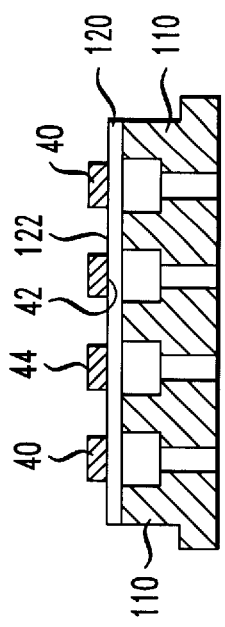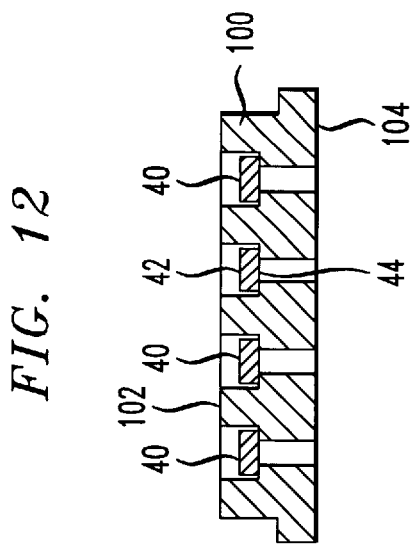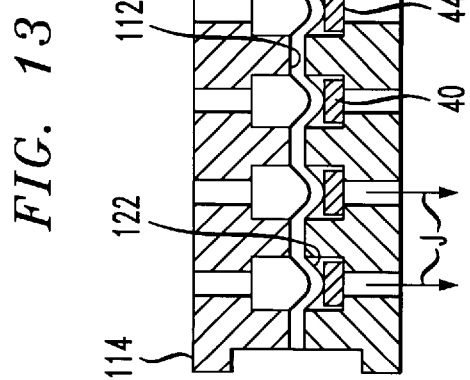

APPARATUS AND METHOD FOR CHIP PROCESSING

FIELD OF THE INVENTION

The present invention relates to an apparatus and method for use in chip processing. More particularly, the present invention relates to an apparatus and method for efficiently and safely transferring semiconductor chips from an input location to an output location.

BACKGROUND OF THE INVENTION

Semiconductor chips are routinely manufactured and coated in one or more locations and then transferred to transportation structures for transport to a distant location for incorporation into electronic packages or devices. Semiconductor chips are formed from wafers. If the semiconductor chips are laser emitters, the completed wafers are scribed and broken into laser bars. The edges of the laser bars are then coated with a dielectric, semi-reflective coating, usually accomplished in an evaporator. The coated bars are then unloaded into waffle packs or onto an adhesive tape. The bars are then electrically tested and then reloaded into the waffle packs or onto the tape. Then the bars are scribed and broken into individual chips. The chips are then placed on an adhesive tape for inspection in an inspection machine, usually with the p contact side facing up. Generally, the adhesive tape is mounted on a supporting hoop.

The hoop is mounted, with the p-contact side of the chips facing up, in a pick and place machine. The pick and place machine is indexed to the first chip. The p-contact side of that chip is inspected on the hoop by an overhead camera looking downwardly. A vacuum collet then picks up the chip and moves it over an upwardly looking camera to inspect the n-contact side. Good chips, namely those chips that pass these two visual inspections of the n- and p-contact sides, are placed in a waffle pack with the p-contact side facing up.

Generally, chips are processed with the p contact facing up. Oftentimes, customers of such chips have a bonding orientation which is p contact down. Thus, each of the chips must be flipped over. It is impractical to flip each chip individually. As noted above, pick and place equipment lodges the chips in a waffle pack. To flip the chips, a second waffle pack is placed in a mirror relationship with the first waffle pack and the waffle packs are flipped to obtain the proper orientation, as shown in FIGS. 12–15.

Specifically, as shown in FIG. 12, a waffle pack 100, having a top side 102 and a bottom side 104, includes a plurality of recessed portions into which chips 40 are placed. The chips 40 have a p contact side 42 and an n contact side 44, and are placed in the recessed portions with the p contact side 42 facing upwardly. A second waffle pack 110, having a top side 112 and a bottom side 114, is positioned over the first waffle pack 100 (FIG. 13) such that the top sides 102, 112 face one another. A piece of adhesive 120 may be placed between the waffle packs 100, 110.

A vacuum may be introduced to the waffle pack 100 in the direction of arrows J. The vacuum creates a pulling force on the adhesive 120 such that the surface 122 of the adhesive 120 comes in contact with and adheres to the semiconductor chips 40. With reference to FIG. 14, after the vacuum has caused the chips 40 to adhere to the adhesive 120, the second carrier 110 is moved away from the carrier 100 in the direction of arrows H. With reference to FIG. 15, the second carrier 110 is re-inverted such that the semiconductor chips 40 are positioned above the surface 122 of the adhesive 120 with the n contact side 44 up.

Alternatively, the waffle packs 100, 110 without the interspersed adhesive 120 can be flipped, thereby causing the chips 40 to move by gravity into residence in the recessed portions of the waffle pack 110 with the n contact side 44 up.

Waffle pack flipping has deficiencies, including spillage of chips and the need for additional manipulation of the chips within the waffle pack, such as, for example, with tweezers or sharpened prods.

SUMMARY OF THE INVENTION

The present invention addresses and overcomes the above-noted deficiencies by providing a semiconductor chip transferring apparatus having a movable element, a support structure having adhesive on a lower surface thereof, and first and second transport assemblies. The first transport assembly is positioned beneath the support structure and has at least one arm rotatable around a first axis. The movable element moves at least part of the support structure containing a chip to transfer the chip to the arm. The second transport assembly is in rotatable connection with the first transport assembly and has at least one arm extending downwardly and rotatable around a second axis. The first transport assembly rotates a chip transferred from the support structure to the second transport assembly which, in turn, transports it to an output container.

The present invention further overcomes the deficiencies found in known methodologies by providing a method of transferring semiconductor chips. The method includes the steps of moving a transfer element into contact with a first side of a flexible film having at least one semiconductor chip adhered to a second side of said flexible film. The transfer element flexes the film and moves the chip. Further, the moved chip is received from the film on a first transport assembly and transferred to a second transport assembly which transfers the chip to an output container.

The method and apparatus, in transferring and transporting the chip causes a first side which is supported by the support structure and a second side which is unsupported to be placed in the container with the first side unsupported and the second side supported by the container.

These and other features and advantages of the invention will be more clearly understood from the following detailed description of the invention which is provided in connection with the accompanying drawings.

BRIEF DESCRIPTION OF THE DRAWINGS

FIG. 12 is a cross-sectional view of a known waffle pack.

FIG. 13 is a cross-sectional view of a pair of waffle packs in a mirrored relationship.

FIG. 14 is a cross-sectional view showing the movement of the second waffle pack from the first waffle pack of FIG. 13.

FIG. 15 is a cross-sectional view of the second waffle pack of FIG. 13.

DETAILED DESCRIPTION OF PREFERRED EMBODIMENTS

Figure 1:
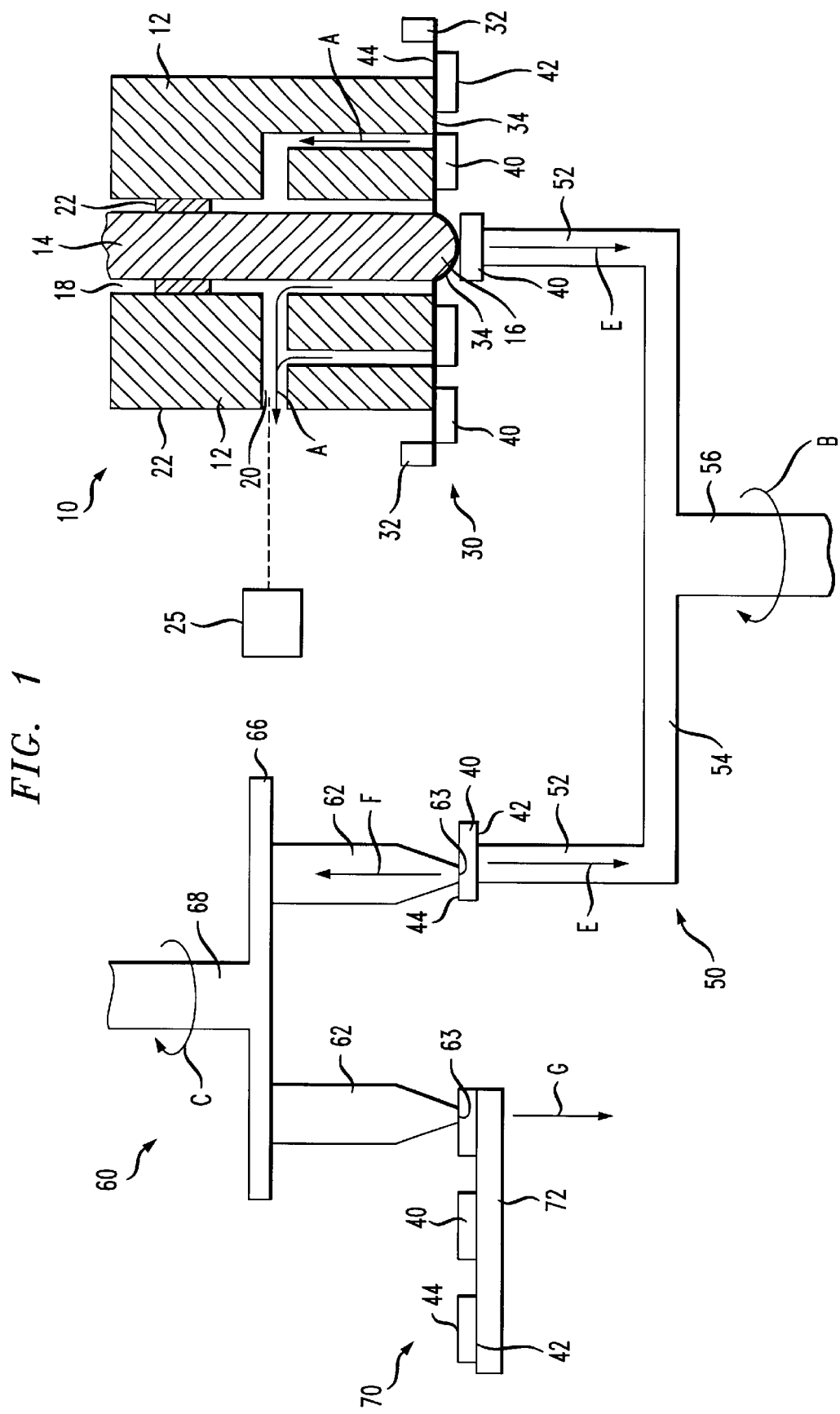
FIG. 1 is a side view of a semiconductor chip transferring apparatus showing an ejector assembly in cross-section constructed in accordance with an embodiment of the present invention.
Figure 2:
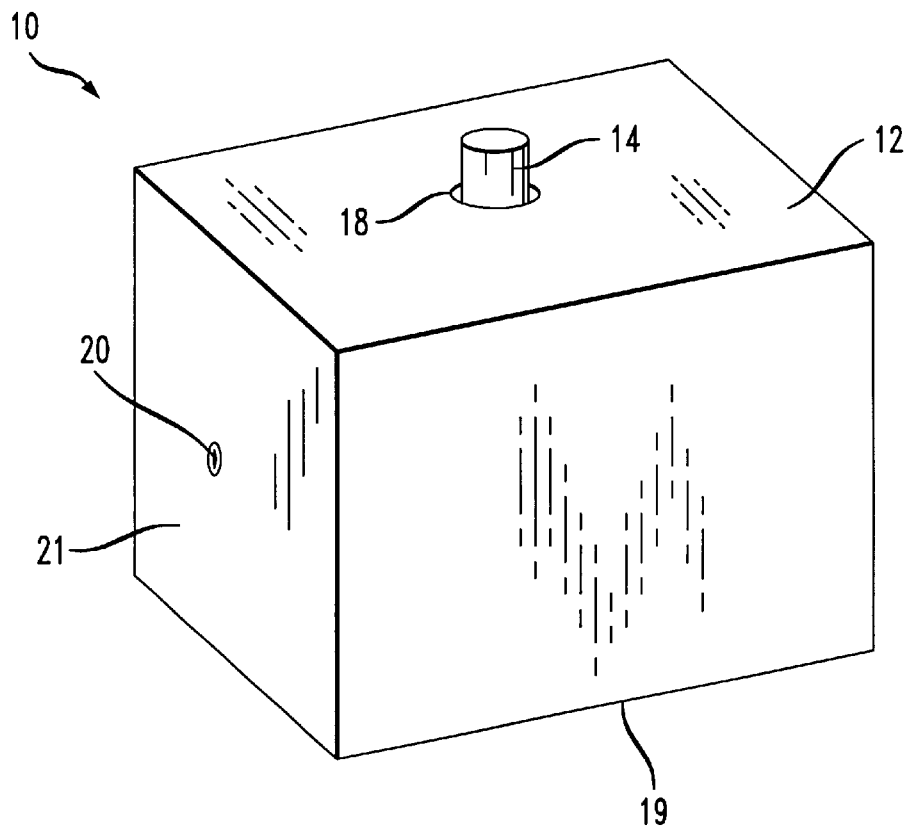
FIG. 2 is a perspective view of the ejector assembly of FIG. 1.
Figure 3:
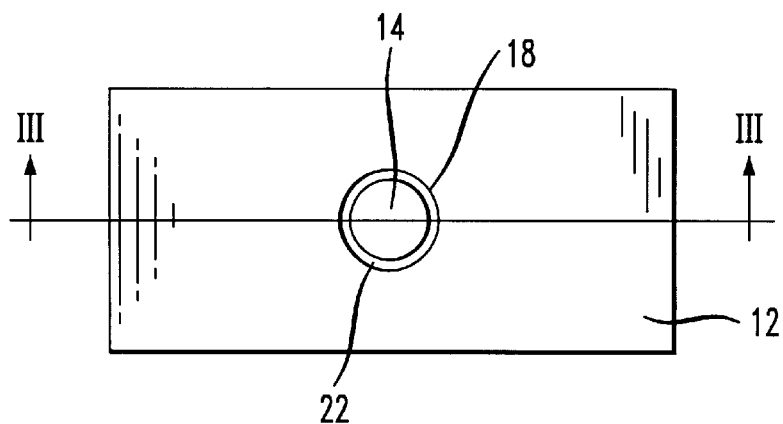
FIG. 3 is a view from the top of the assembly of FIG. 1.
Figure 4:
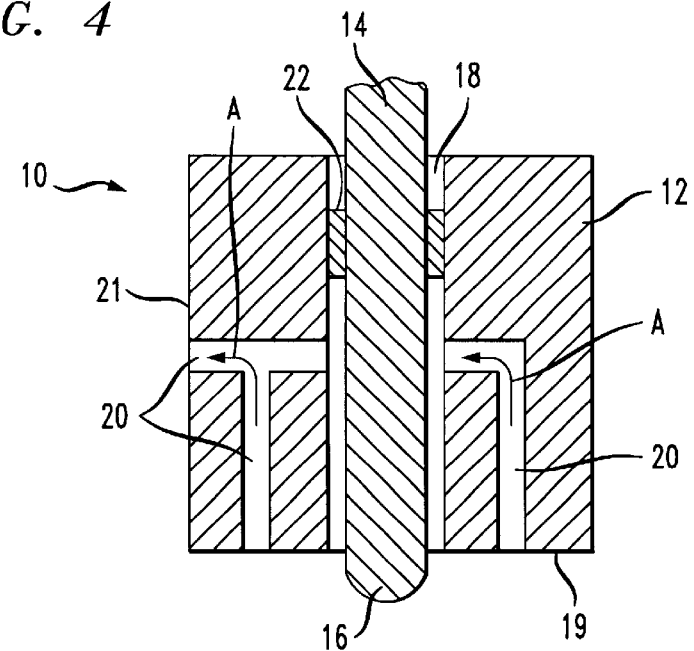
FIG. 4 is a cross-sectional view along line III—III of the ejector assembly of FIG. 2.

FIGS. 1–4 illustrate an embodiment of the invention. As shown therein, an ejector assembly 10 is provided which includes an anvil 12 and a piston 14. The anvil 12 includes a plurality of openings 20 (FIG. 4) which extend from a lower surface 19 to a side surface 21.

The piston 14 extends through an opening 18 creating an annular space into which a seal 22 fits. An end 16 of the piston 14 is rounded. Alternatively, the end 16 may have a different shape, such as, for example, a shape having a reduced diameter as compared with the remainder of the piston 14. The piston 14 is extended through the opening 18 to push against and elastically deform a tape 34 supported by the hoop 30 (described in detail below). The tape 34 has an adhesive surface to which a plurality of chips 40 are adhered.

Figure 5:
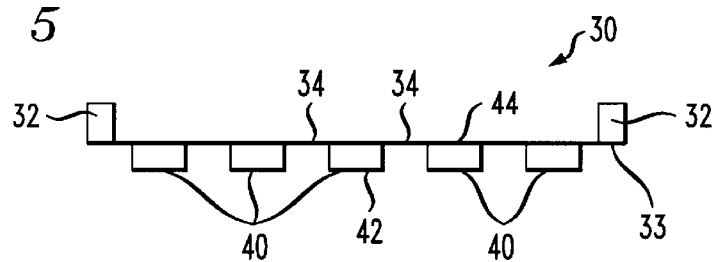
FIG. 5 is a view from the side of the hoop of FIG. 1.
Figure 6:
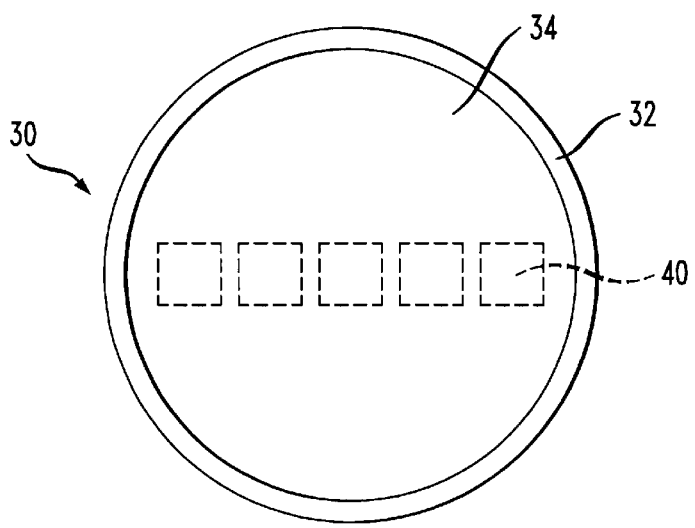
FIG. 6 is a view from the top of the hoop of FIG. 1.

The hoop 30, which is shown in greater detail in FIGS. 5–6, includes a hoop frame 32 surrounding the periphery thereof. A tape 34 extends across the hoop 30 and is affixed to a surface 33 of the hoop frame 32. The tape 34 has an adhesive side facing away from the surface 33. Further, the tape 34 is affixed to the surface 33 by way of an adhesive strip corresponding to the circular profile of the hoop frame 32 and positioned on the side of the tape 34 facing toward the surface 33, or alternatively, by way of a separate adhering structure. The separate adhering structure could include clamps, clips, or a layer of glue or other adherent being located on the tape 34 or surface of the hoop frame 32. The adhering side of the tape 34 is used for adhering semiconductor chips 40, although other similar objects may be so adhered.

The hoop 30 is used for providing a stable mounting structure for the chips 40 during transportation from an input location, such as the point of manufacture, to an output location (described in detail below). As shown, the chips 40 are oriented such that the p contact side 42 is away from the tape 34 and facing downwardly.

Returning to FIG. 1, a chip 40 mounted on the tape 34 is removed from the tape 34 by the piston 14. When actuated, the piston 14 pushes into the back side of the tape 34 to move the tape 34, and the chip 40 positioned at the location on the tape 34 corresponding to the location of the piston 14, out of a plane containing the remaining chips 40 and towards and onto an arm 52 of a first transport assembly 50.

Figure 7:
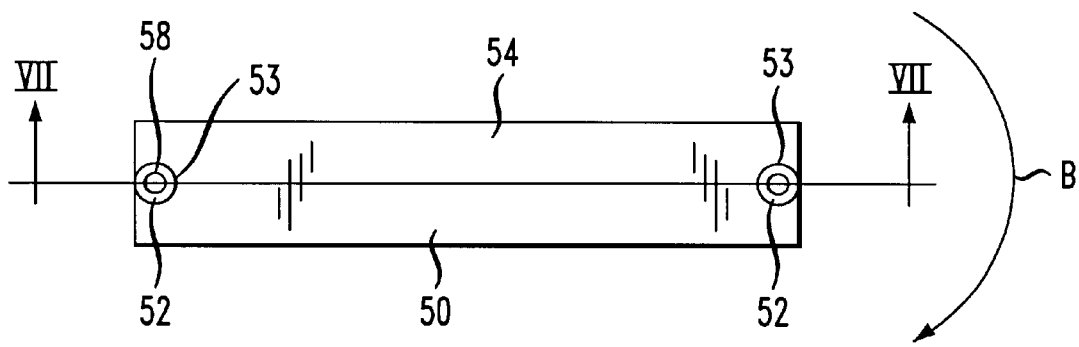
FIG. 7 is a view from the top of the swing arm assembly of FIG. 1.
Figure 8:
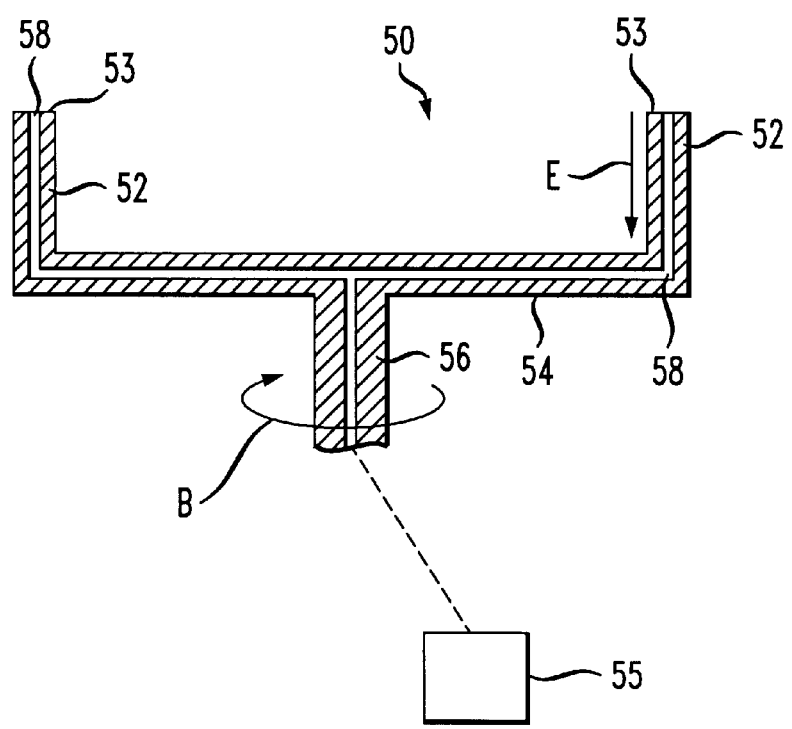
FIG. 8 is a cross-sectional view along line VII—VII of the swing arm assembly of FIG. 7.
Figure 9:
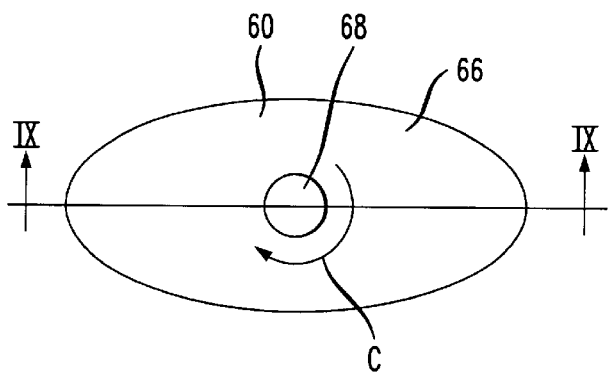
FIG. 9 is a view from the top of the handler pickup tool of FIG. 1.
Figure 10:
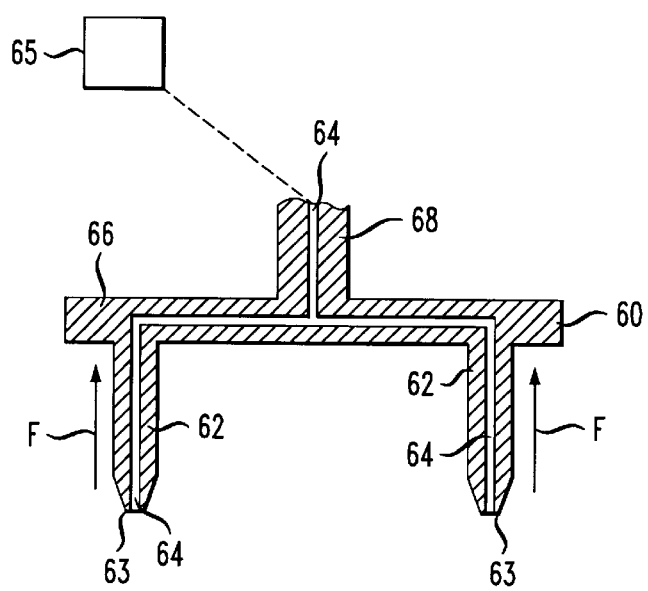
FIG. 10 is a cross-sectional view along line IX—IX of the handler pickup tool of FIG. 9.

FIGS. 1, 7–8 show the first transport assembly 50 used to transfer the chips 40 from the hoop 30 to the second transport assembly 60 (FIGS. 9–10, to be described in detail below). The first transport assembly 50 includes a pair of arms 52 mounted on a base 54. The base 54 is itself mounted on a rotatable leg 56. As illustrated in FIGS. 1, 8, the leg 56 rotates about an axis in a direction of the arrow B, although it is understood that the leg 56 may rotate in a direction opposite the arrow B. A vacuum opening 58 is located at an end 53 of the arms 52. A vacuum is exerted by way of a pump 55 (shown schematically in FIG. 8) or other suitable device providing a force through the openings 58 in a direction of the arrow E.

By the rotation of the leg 56, the arm 52 is swung toward the second transport assembly 60, shown in FIGS. 1, 9–10. The second transport assembly 60, which is utilized to transfer the chips 40 from the first transport assembly 50 to an output location, includes a pair of downwardly extending pickup tools 62 mounted upon a base 66. The base 66 is mounted on a rotatable arm 68. The arm 68 rotates about an axis in a direction of the arrow C, although it is understood that the arm 68 may rotate in a direction opposite the arrow C. An opening 64 is located at an end 63 of the tools 62, through which a vacuum is exerted by way of a pump 65 (shown schematically in FIG. 10), or other suitable device. This vacuum assists in maintaining the mounting of the chip 40 on the end 63 of the tool 62 during transfer to the output location, namely an output container 70.

Figure 11:
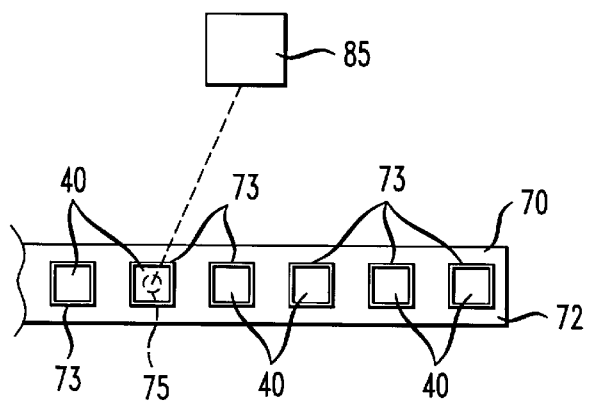
FIG. 11 is a partial view from the top of the output pack of FIG. 1.

The output container 70 includes a base 72 and a plurality of output locations 73 on the base 72 for placing one or more semiconductor chips 40 (FIGS. 1, 11). The locations 73 may be along a top plane of the base 72, or alternatively, the locations 73 may include recessed portions of the container 70.

In operation, the anvil 12 and the piston 14 are used to dismount the chips 40 from the hoop 30. The remaining structures in FIG. 1, namely the first transport assembly 50 and the second transport assembly 60 are utilized to transport the chips 40 to the output container 70.

As shown in FIG. 1, a vacuum is pulled, by way of a pump 25 (shown schematically) or other suitable device, through the openings 20, thereby creating a force in the direction of the arrows A away from the hoop 30. This force keeps the hoop 30 in place while the semiconductor chips 40 are transferred to the first transport assembly 50. Further, the force prevents the tape 34 from sagging due to the force of gravity. The seal 22 prevents leakage of the vacuum through the opening 18, allowing the vacuum to be directed through the openings 20.

As shown in FIG. 1, the piston 14 is pushed into the tape 34 at a location directly above a semiconductor chip 40. The adhering side of the tape 34 faces downwardly. One of the swing arms 52 is positioned directly beneath the semiconductor chip 40 adhered to the tape 34. The piston 14 pushes down on the tape 43 directly above the chip 40, pushing the chip 40 toward the vacuum opening 58 on the end 53 of one arm 52. The rounded end 16 of the piston 14 causes portions of the chip 40 to become loosened from the tape 34 as a chip 40 is transferred to the swing arm 52. During this transfer, the piston 14 is retracted to its original position.

The force in the direction of the arrow E from the vacuum from the pump 55 pulled through the opening 58 combines with the retraction of the piston 14 to transfer the chip 40 from the hoop 30 to the swing arm 52. Once the chip 40 has been transferred to the swing arm 52, the hoop 30 may be reoriented under the anvil 12 to place another chip 40 beneath the piston 14. The force from the vacuum keeps the chip 40 mounted on the end 53 of the arm 52 while the leg 56 rotates in the direction of arrow B, thereby swinging the arm 52 with the chip 40 away from the hoop 30.

The arm 52 with the chip 40 is swung underneath one of the tools 62 of the second transport assembly 60. A vacuum is exerted from the pump 65 through the opening 64 onto the chip 40. The vacuum pulled in the direction of arrow F creates a force through the opening 64 which may be greater than the force of the vacuum being pulled in the direction E through the opening 58 in the arm 52. Alternatively, the vacuum exerted through the opening 58 may be shut off. Either way, the chip 40 is transferred from the arm 52 to the tool 62.

In an alternative embodiment, the ends 63 may include adhesive properties similar to the adhesive properties on the adhesive side of the hoop 30. The adhesive properties on the ends 63 may be greater than the vacuum being exerted in the direction of arrow E through the arms 52, or the vacuum through the arms 52 may be shut off, allowing the chip to be transferred to the end 63 of the arm 62.

Once the chip 40 is secured to the tool 62, either via vacuum or adhesive, or both, the rotatable arm 68 is rotated in a direction of arrow C. The tool 62 is rotated to a position above the output container 70. The vacuum being exerted from the pump 65 through the opening 64 is shut off, allowing the chip 40 to settle on an output location 73 of the output container 70. Alternatively, as shown in FIGS. 1, 11, for the embodiment having an adhesive on the end 63, a vacuum may be exerted, by way of a pump 85 (shown schematically in FIG. 11) or other similar device, through an opening 75 in the locations 73 of the output container 70 in a direction of the arrow G (FIG. 1). The vacuum exerted in the direction G must be greater than the adherent strength of the adhesive on the end 63 for the chip to be transferred to the location 73 of the output container 70.

Through the above described method and apparatus, a semiconductor chip 40, which is adhered to the tape 34 with the p contact side up, is delivered to the output container 70 with the p contact side down. When on the tape 34, the p contact side of the chip 40 is unsupported, while the n contact side is supported by the tape 34. Upon transfer of the chip 40 to the first transport assembly 50, the p contact side is supported by one of the swing arms 52. One of the pickup tools 62 supports the n contact side of the chip 40 upon its transfer to the second transport assembly 60. And, upon final transport to the output container 70, the p contact side of the chip 40 is supported in the location 73.

It is possible to transfer one semiconductor chip 40 from the swing arm assembly 50 to the second transport assembly 60 while transferring another chip 40 from the anvil 12 to the swing arm assembly 50. Further, a chip 40 may be transferred from the second transport assembly 60 to the output container 70 while another chip 40 is transferred from the swing arm assembly 50 to the second transport assembly 60.

In the above described embodiments, a plurality of semiconductor chips can be efficiently transferred from a processing unit to a transporting container with proper orientation and with a reduced likelihood of damage to the chips.

While the invention has been described in detail in connection with the preferred embodiments known at the time, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Accordingly, the invention is not to be seen as limited by the foregoing description, but is only limited by the scope of the appended claims.

What is claimed as new and desired to be protected by Letters Patent of the United States is:

1. A semiconductor chip transferring apparatus, comprising:
    a movable element;
    a support structure having adhesive on a lower surface thereof;
    a first transport assembly positioned beneath said support structure and having at least one arm rotatable around a first axis, wherein said movable element moves at least part of said support structure to transfer a semiconductor chip supported on said support structure to said at least one arm; and
    a second transport assembly in rotatable connection with said first transport assembly and having at least one arm extending downwardly and rotatable around a second axis, wherein said first transport assembly rotates a chip transferred from said support structure to said second transport assembly.

2. The apparatus of claim 1, wherein said support structure is flexible.

3. The apparatus of claim 2, wherein said support structure comprises a flexible adhesive film, a plurality of chips being supported on a first side of said flexible adhesive film, said movable element moving to engage with a second side of said adhesive film opposite said first side and moving a chip to said arm of said first transport assembly.

4. The apparatus of claim 2, further comprising a support element having an opening, wherein said movable element is movable through said opening.

5. The apparatus of claim 4, further comprising at least one vacuum port located in said support element and directed to said support structure, wherein said vacuum port is adapted to receive a vacuum which prevents said support structure from sagging.

6. The apparatus of claim 5, further comprising a seal in said opening and surrounding said movable element.

7. The apparatus of claim 2, wherein said movable element has a rounded end for engaging with said support structure.

8. The apparatus of claim 2, wherein said first transport assembly comprises a plurality of arms and a base mounted to rotate about said first axis, said base supporting said plurality of arms.

9. The apparatus of claim 8, wherein said first transport assembly comprises two said arms.

10. The apparatus of claim 9, wherein said arms are positioned at a periphery of said base.

11. The apparatus of claim 9, wherein said first transport assembly further comprises a channel extending to an end of each said arm, said channel adapted to receive a vacuum from a vacuum source.

12. The apparatus of claim 9, wherein ends of said first transport assembly arms comprise an adhesive for contacting with a chip transferred from said support structure.

13. The apparatus of claim 2, wherein said second transport assembly comprises a plurality of said arms extending downwardly from a base mounted to rotate about said second axis.

14. The apparatus of claim 13, wherein said second transport assembly comprises two said arms.

15. The apparatus of claim 14, wherein said second transport assembly further comprises a channel extending to an end of each said arm, said channel adapted to receive a vacuum from a vacuum source.

16. The apparatus of claim 14, wherein ends of said second assembly arms comprise an adhesive for contacting with a chip transferred from said first transport assembly.

17. The apparatus of claim 1, further comprising an output area, said second transport assembly transporting a chip received from said first transport assembly to said output area.

18. The apparatus of claim 17, wherein said output area comprises a container having a plurality of locations for receiving one or more chips transported to said output area by said second transport assembly.

19. The apparatus of claim 18, wherein said locations are recessed in a surface of said container.

20. The apparatus of claim 19, wherein each said location further comprises an opening adapted to receive a vacuum therethrough.

21. A semiconductor chip transferring apparatus, comprising:
   a movable element;
   a support structure including a flexible film having an adhesive lower surface;
   a first transport assembly positioned beneath said support structure and having at least one arm rotatable around a first axis, wherein said movable element engages with and moves at least part of said support structure to transfer a semiconductor chip supported on said support structure to said at least one arm;
   a second transport assembly in rotatable connection with said first transport assembly and having at least one arm extending downwardly and rotatable around a second axis, wherein said first transport assembly rotates a chip transferred to an arm of said first transport assembly to said second transport assembly; and
   an output area, said second transport assembly transporting a chip received from said first transport assembly to said output area.

22. The apparatus of claim 21, wherein a plurality of chips are supported on a first side of said flexible adhesive film, said movable element moving to engage with a second side of said adhesive film opposite said first side and moving a chip to said arm of said first transport assembly.

23. The apparatus of claim 22, wherein said output area comprises a container having a plurality of locations for receiving one or more chips transported to said output area by said second transport assembly.

24. The apparatus of claim 23, wherein said locations are recessed in a surface of said output pack.

25. The apparatus of claim 23, wherein each said location further comprises an opening adapted to receive a vacuum therethrough.

26. The apparatus of claim 22, further comprising a support element having an opening, wherein said movable element is movable through said opening.

27. The apparatus of claim 26, further comprising at least one vacuum port located in said support element and directed to said support structure, wherein said vacuum port is adapted to receive a vacuum which prevents said support structure from sagging.

28. The apparatus of claim 27, further comprising a seal in said opening and surrounding said rod, said rod being movable through said opening.

29. The apparatus of claim 21, wherein said movable element has a rounded end for engaging with said support structure.

30. The apparatus of claim 21, wherein said support structure comprises a flexible adhesive film, a plurality of chips being supported on a first side of said flexible adhesive film, said movable element engaging with a second side of said adhesive film opposite said first side.

31. The apparatus of claim 21, wherein said first transport assembly comprises a plurality of arms and a base mounted to rotate about said first axis, said base supporting said plurality of arms.

32. The apparatus of claim 30, wherein said first transport assembly comprises two said arms.

33. The apparatus of claim 32, wherein said arms are positioned at a periphery of said base.

34. The apparatus of claim 32, wherein said first transport assembly further comprises a channel extending to an end of each said arm, said channel adapted to receive a vacuum from a vacuum source.

35. The apparatus of claim 32, wherein ends of said first transport assembly arms comprise an adhesive for contacting with a chip transferred from said support structure.

36. The apparatus of claim 21, wherein said second transport assembly comprises a plurality of said arms extending downwardly from a base mounted on said second axis.

37. The apparatus of claim 36, wherein said second transport assembly comprises two said arms.

38. The apparatus of claim 37, wherein said second transport assembly further comprises a channel extending to an end of each said arm, said channel adapted to receive a vacuum from a vacuum source.

39. The apparatus of claim 37, wherein ends of said second assembly arms comprise an adhesive for contacting with a chip transferred from said first transport assembly.

40. A semiconductor chip transferring apparatus, comprising:
   a flexible chip holder for holding a plurality of semiconductor chips in a plane;
   a removal device for removing a chip from said flexible chip holder, said removal device including a movable element which engages with and flexes said chip holder at a location containing a chip to move the chip at said location out of said plane; and
   a transport device for receiving a chip moved out of said plane by said movable element and transporting it to an output location, said transport device comprising:
      a first transport assembly positioned beneath said flexible chip holder and having at least one arm rotatable around a first axis, wherein said removal device at least partially moves said flexible chip holder to transfer a semiconductor chip supported on said flexible chip holder to said at least one arm; and
      a second transport assembly in rotatable connection with said first transport assembly and having at least one arm extending downwardly and rotatable around a second axis, wherein said first transport assembly rotates a chip transferred from said flexible chip holder to said second transport assembly.

41. The apparatus of claim 40, wherein said flexible chip holder comprises a flexible adhesive film, said plurality of chips being supported on a first side of said flexible adhesive film, said removal device engaging with a second side of said adhesive film opposite said first side.

42. The apparatus of claim 41, further comprising a support element having an opening, wherein said removal device is movable through said opening.

43. The apparatus of claim 42, further comprising at least one vacuum port located in said support element and directed to said flexible chip holder, wherein said vacuum port is adapted to receive a vacuum which prevents said flexible chip holder from sagging.

44. The apparatus of claim 43, further comprising a seal in said opening and surrounding said removal device.

45. The apparatus of claim 41, wherein said removal device has a rounded end for engaging with said second side of said flexible chip holder.

46. The apparatus of claim 40, wherein said first transport assembly comprises a base mounted to rotate about said first axis and supporting a plurality of said arms.

47. The apparatus of claim 46, wherein said first transport assembly comprises two said arms positioned at a periphery of said base.

48. The apparatus of claim 47, wherein said first transport assembly further comprises a channel extending to an end of each said arm, said channel adapted to receive a vacuum from a vacuum source.

49. The apparatus of claim 47, wherein ends of said first transport assembly arms comprise an adhesive for contacting with a chip transferred from said flexible chip holder.

50. The apparatus of claim 40, wherein said second transport assembly comprises a plurality of said arms extending downwardly from a base mounted on said second axis.

51. The apparatus of claim 50, wherein said second transport assembly comprises two said arms.

52. The apparatus of claim 51, wherein said second transport assembly further comprises a channel extending to an end of each said arm, said channel adapted to receive a vacuum from a vacuum source.

53. The apparatus of claim 51, wherein ends of said second assembly arms comprise an adhesive for contacting with a chip transferred from said first transport assembly.

54. A method of transferring semiconductor chips, comprising the steps of:
    moving a transfer element into contact with a first side of a flexible film having at least one semiconductor chip adhered to a second side of said flexible film, said transfer element flexing said film and moving said chip;
    receiving the moved chip from said flexible film on a first transport assembly; and
    transferring the chip from said first transport assembly to a second transport assembly, wherein said transferring step comprises the steps of:
        moving the first transport assembly to a position beneath the second transport assembly; and
        exerting a force on the chip in the direction of the second transport assembly.

55. The method of claim 54, wherein said step of receiving the moved chip comprises the steps of:
    extending a movable element through an opening in a support element and into contact with the first side of the flexible film;
    moving the chip adhered to the second side of the flexible film into contact with the first transport assembly; and
    exerting a force on the chip in a direction away from the second side of the flexible film.

56. The method of claim 55, wherein said force on the chip comprises a force induced by a vacuum.

57. The method of claim 54, wherein said force on the chip comprises a force induced by a vacuum.

58. The method of claim 57, wherein said force on the chip comprises an adhesive on an end of the second transport assembly.

59. The method of claim 54, further comprises the step of transferring the chip from the second transport assembly to an output area.

60. The method of claim 59, wherein said step of transferring the chip from the second transport assembly to the output area comprises the steps of:
    exerting a force on the chip in a direction of the second transport assembly;
    moving said second transport assembly to a position above the output area; and
    exerting a force on the chip in the direction of the output area.

61. The method of claim 60, wherein said step of exerting the force on the chip comprises releasing the vacuum being exerted on the chip in the direction of the second transport assembly.

62. The method of claim 60, wherein said step of exerting the force on the chip comprises exerting a vacuum on the chip in a direction of the output tray.

63. A method of inverting a semiconductor chip having a surface initially supported on an upper surface of a flexible support structure, said method comprising the steps of:
    inverting said flexible support structure such that said upper surface is directed downwardly;
    transferring the semiconductor chip to a first transport assembly such that said chip surface is unsupported and directed upwardly;
    transferring the semiconductor chip to a second transport assembly such that said chip surface is supported and directed upwardly; and
    transporting the chip to an output container such that said chip surface is unsupported and directed upwardly.

64. The method of claim 63, wherein said flexible support structure flexes downwardly for transferring the semiconductor chip to said first transport assembly.

65. The method of claim 64, wherein said first transport assembly comprises at least one arm in rotatable connection with said flexible support structure and said second transport assembly.

66. The method of claim 65, wherein said second transport assembly comprises at least one arm in rotatable connection with said first transport assembly and said output container.

67. The method of claim 66, wherein said second transport assembly arm supports said surface of the semiconductor chip.

* * * * *